(12) United States Patent
Fukushima et al.

(10) Patent No.: US 9,573,241 B2
(45) Date of Patent: Feb. 21, 2017

(54) POLISHING APPARATUS AND POLISHING METHOD

(71) Applicant: EBARA CORPORATION, Tokyo (JP)

(72) Inventors: Makoto Fukushima, Tokyo (JP); Hozumi Yasuda, Tokyo (JP); Keisuke Namiki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/854,530

(22) Filed: Sep. 15, 2015

(65) Prior Publication Data

US 2016/0074989 A1 Mar. 17, 2016

(30) Foreign Application Priority Data

Sep. 17, 2014 (JP) ................. 2014-189291

(51) Int. Cl.
| | |
|---|---|
| *C23F 1/00* | (2006.01) |
| *B24B 37/005* | (2012.01) |
| *B24B 37/04* | (2012.01) |
| *H01L 21/3105* | (2006.01) |
| *H01L 21/321* | (2006.01) |

(52) U.S. Cl.
CPC ........... *B24B 37/005* (2013.01); *B24B 37/042* (2013.01); *H01L 21/31053* (2013.01); *H01L 21/3212* (2013.01)

(58) Field of Classification Search
CPC ...... B24B 53/02; B24B 53/005; B24B 53/017; B24B 37/005; B24B 37/32; B24B 37/013; H01L 21/3212; H01L 21/3062; H01L 21/30607

USPC ............. 216/88, 89, 92; 156/345.11, 345.12, 156/345.13, 345.15; 438/692, 693
See application file for complete search history.

(56) References Cited

U.S. PATENT DOCUMENTS

| | | | |
|---|---|---|---|
| 6,290,584 B1 | 9/2001 | Kim et al. | |
| 2006/0166608 A1* | 7/2006 | Chalmers | B24B 37/013 451/6 |
| 2006/0183407 A1* | 8/2006 | David | B24B 37/013 451/5 |
| 2012/0309267 A1* | 12/2012 | Shinozaki | B24B 37/042 451/8 |
| 2013/0324012 A1* | 12/2013 | Fukushima | B24B 37/005 451/1 |
| 2014/0357164 A1 | 12/2014 | Nabeya et al. | |

FOREIGN PATENT DOCUMENTS

| | | |
|---|---|---|
| JP | 2002-079454 A | 3/2002 |
| JP | 2006-324413 A | 11/2006 |

* cited by examiner

*Primary Examiner* — Lan Vinh
(74) *Attorney, Agent, or Firm* — Baker & Hostetler LLP

(57) ABSTRACT

A polishing apparatus capable of eliminating a variation in film thickness along a circumferential direction of a substrate, such as a wafer, is disclosed. The polishing apparatus includes: a polishing head including an elastic membrane for pressing the substrate against the polishing surface and a retainer ring arranged so as to surround the substrate, the retainer ring being capable of contacting the polishing surface; a rotating mechanism configured to rotate the polishing head about its own axis; a rotation angle detector configured to detect a rotation angle of the polishing head; and a polishing controller configured to periodically change a polishing condition of the substrate in synchronization with the rotation angle of the polishing head.

16 Claims, 11 Drawing Sheets

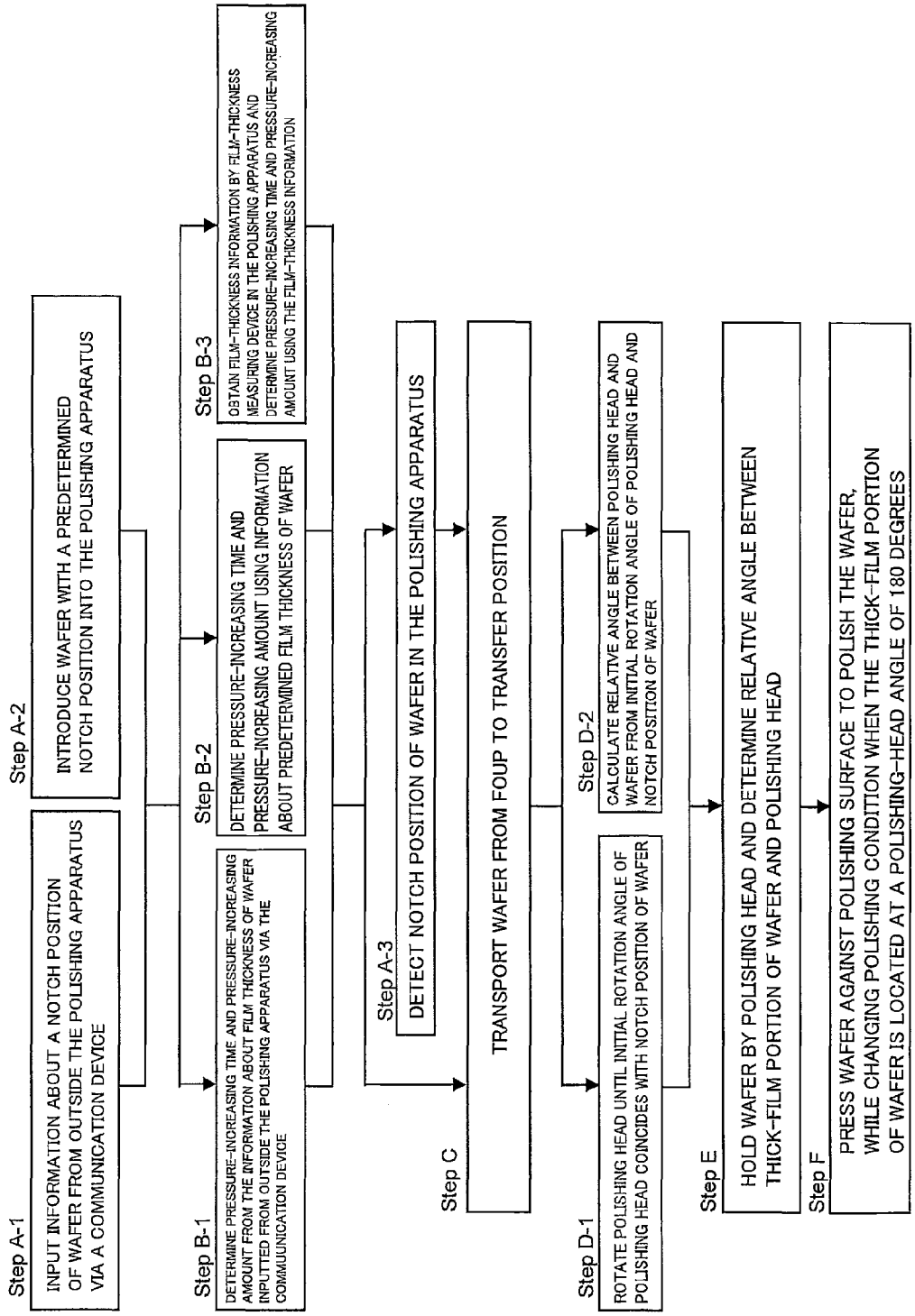

POLISHING APPARATUS AND POLISHING METHOD

CROSS REFERENCE TO RELATED APPLICATION

This document claims priority to Japanese Patent Application Number 2014-189291 filed Sep. 17, 2014, the entire contents of which are hereby incorporated by reference.

BACKGROUND

With a recent trend toward higher integration and higher density in semiconductor devices, circuit interconnects become finer and finer and the number of levels in multilayer interconnects is increasing. In the fabrication process of the multilayer interconnects with finer circuit, as the number of interconnect levels increases, film coverage of step geometry (or step coverage) is lowered in thin film formation because surface steps grow while following surface irregularities on a lower layer. Therefore, in order to fabricate the multilayer interconnects, it is necessary to improve the step coverage and planarize the surface. It is also necessary to planarize semiconductor device surfaces so that irregularity steps formed thereon fall within a depth of focus in optical lithography. This is because finer optical lithography entails shallower depth of focus.

Accordingly, the planarization of the semiconductor device surfaces is becoming more important in the fabrication process of the semiconductor devices. Chemical mechanical polishing (CMP) is the most important technique in the surface planarization. This chemical mechanical polishing is a process of polishing a wafer by bringing the wafer into sliding contact with a polishing surface of a polishing pad while supplying a polishing liquid containing abrasive grains, such as silica ($SiO_2$), onto the polishing surface.

A polishing apparatus for performing CMP has a polishing table that supports the polishing pad thereon, and a substrate holder, which is called a top ring or a polishing head, for holding a wafer. When the wafer is polished using such a polishing apparatus, the substrate holder holds the wafer and presses it against the polishing surface of the polishing pad at a predetermined pressure, while the polishing table and the substrate holder are moved relative to each other to bring the wafer into sliding contact with the polishing surface to thereby polish a surface of the wafer.

As the types of semiconductor devices have been increasing dramatically in recent years, there has been a demand for polishing films having different film-thickness distributions for devices or CMP processes (e.g., an oxide film polishing process and a metal film polishing process). The reason of this is that each wafer has a different initial film-thickness distribution because a film-forming process, which is performed prior to the CMP process, varies depending on the type of film.

Generally, a wafer is required to have a uniform film-thickness distribution over an entire surface of the wafer. In a case where a wafer has different initial film thicknesses along a radial direction of the wafer, it is possible to control polishing rates (which are also referred to as removal rates) along the radial direction of the wafer by regulating pressures in a plurality of concentric pressure chambers which are formed by an elastic membrane in contact with the wafer, as shown in Japanese laid-open patent publication No. 2006-324413.

An initial film thickness of a wafer, to be polished, may vary along a circumferential direction of the wafer due to a characteristic of a film-forming device. In particular, the initial film thickness in a peripheral portion of the wafer tends to vary along the circumferential direction. In order to reduce such a variation in the film thickness, there have been proposed several polishing apparatuses. For example, Japanese laid-open patent publication No. 2002-079454 discloses a polishing apparatus which uses an annular piston divided into several pistons arranged along a circumferential direction of a wafer. Further, Japanese laid-open patent publication No. 2006-324413 discloses a substrate holder which has a pressure chamber for pressing a retainer ring. This pressure chamber is divided into several chambers arranged along a circumferential direction.

However, these polishing apparatuses use the divided pressing elements arranged along the circumferential direction of the wafer, and therefore the substrate holder entails an extremely complicated structure. Moreover, a pressing force may vary between the divided pressing elements. For example, in the Japanese laid-open patent publication No. 2006-324413, there may be a variation in expansion and contraction of the divided pressure chambers. Further, in the Japanese laid-open patent publication No. 2002-079454, a sliding resistance, which is generated when each piston is lowered, may vary between the pistons.

In particular, the substrate holder disclosed in the Japanese laid-open patent publication No. 2002-079454 has a plurality of divided rigid pistons, which are arranged along the circumferential direction of the wafer and press the wafer. With this structure, the polishing rate of the wafer may be discontinuous in the circumferential direction. Additionally, a variation in flatness of the pistons may result in a variation in polishing rate of the wafer.

SUMMARY OF THE INVENTION

According to embodiments, there are provided a polishing apparatus and a polishing method capable of eliminating a variation in film thickness along a circumferential direction of a substrate, such as a wafer.

Embodiments, which will be described below, relate to a polishing apparatus and a polishing method for polishing a substrate, such as a wafer.

In an embodiment, there is provided a polishing apparatus for polishing a substrate by bringing the substrate into sliding contact with a polishing surface, comprising: a polishing head including an elastic membrane for pressing the substrate against the polishing surface and a retainer ring arranged so as to surround the substrate, the retainer ring being capable of contacting the polishing surface; a rotating mechanism configured to rotate the polishing head about its own axis; a rotation angle detector configured to detect a rotation angle of the polishing head; and a polishing controller configured to periodically change a polishing condition of the substrate in synchronization with the rotation angle of the polishing head.

In an embodiment, the polishing controller is configured to obtain an initial angle of the substrate indicating an orientation of the substrate with respect to a circumferential direction of the substrate before the substrate is held by the polishing head, and obtain an initial rotation angle of the polishing head before holding the substrate.

In an embodiment, the polishing controller is configured to obtain the initial angle of the substrate from outside the polishing apparatus via a communication device. In an embodiment, the polishing apparatus further comprises a notch detector configured to detect a notch formed in the substrate, wherein the polishing controller is configured to obtain the initial angle of the substrate from a position of the notch.

In an embodiment, the elastic membrane defines an annular pressure chamber into which a fluid is to be supplied for pressing the substrate against the polishing surface, the polishing apparatus further comprises a pressure regulator configured to regulate a pressure of the fluid in the annular pressure chamber, and the polishing controller is configured to operate the pressure regulator to periodically change the pressure in the annular pressure chamber in synchronization with the rotation angle of the polishing head.

In an embodiment, the polishing apparatus further comprises a retainer-ring pressing mechanism configured to press the retainer ring against the polishing surface, wherein the polishing controller is configured to operate the retainer-ring pressing mechanism to periodically change a pressure of the retainer ring against the polishing surface in synchronization with the rotation angle of the polishing head.

In an embodiment, the polishing apparatus further comprises a vertically moving mechanism configured to elevate and lower the polishing head, wherein the polishing controller is configured to operate the vertically moving mechanism to periodically change a height of the polishing head in synchronization with the rotation angle of the polishing head.

In an embodiment, the polishing apparatus further comprises a local-load exerting device configured to apply a local load to a part of the retainer ring, wherein the polishing controller is configured to operate the local-load exerting device to periodically change the local load in synchronization with the rotation angle of the polishing head.

In an embodiment, the polishing controller is configured to periodically change an angular velocity of the polishing head in synchronization with the rotation angle of the polishing head.

In an embodiment, there is provided a polishing method of polishing a substrate by bringing the substrate into sliding contact with a polishing surface, comprising: holding the substrate by a polishing head; pressing the substrate against the polishing surface by the polishing head while rotating the polishing head; and changing a polishing condition of the substrate periodically in synchronization with a rotation angle of the polishing head when the substrate is pressed against the polishing surface.

In an embodiment, the polishing method further comprises: obtaining an initial angle of the substrate indicating an orientation of the substrate with respect to a circumferential direction of the substrate before the substrate is held by the polishing head; and obtaining an initial rotation angle of the polishing head before holding the substrate.

In an embodiment, changing the polishing condition comprises periodically changing a pressing force of the polishing head applied to the substrate in synchronization with the rotation angle of the polishing head.

In an embodiment, the polishing head has a retainer ring surrounding the substrate and being placed in contact with the polishing surface, and changing the polishing condition comprises periodically changing a pressure of the retainer ring against the polishing surface in synchronization with the rotation angle of the polishing head.

In an embodiment, changing the polishing condition comprises periodically changing a height of the polishing head in synchronization with the rotation angle of the polishing head.

In an embodiment, the polishing head has a retainer ring surrounding the substrate and being placed in contact with the polishing surface, pressing the substrate against the polishing surface by the polishing head while rotating the polishing head comprises pressing the substrate against the polishing surface by the polishing head and applying a local load to a part of the retainer ring while rotating the polishing head, and changing the polishing condition comprises periodically changing the local load in synchronization with the rotation angle of the polishing head.

In an embodiment, changing the polishing condition comprises periodically changing an angular velocity of the polishing head in synchronization with the rotation angle of the polishing head.

According to the above-described embodiments, the polishing condition is periodically changed in synchronization with the rotation angle of the polishing head. A change in the polishing condition is greatly reflected in a film thickness of a substrate. Therefore, a polishing rate (or removable rate) along the circumferential direction of the substrate can be controlled, and a variation in the film thickness along the circumferential direction of the substrate can be eliminated.

BRIEF DESCRIPTION OF THE DRAWINGS

FIG. 12 is a flow chart showing a method of determining a relative angle between an angle of the wafer and an polishing-head angle.

DESCRIPTION OF EMBODIMENTS

Figure 1:
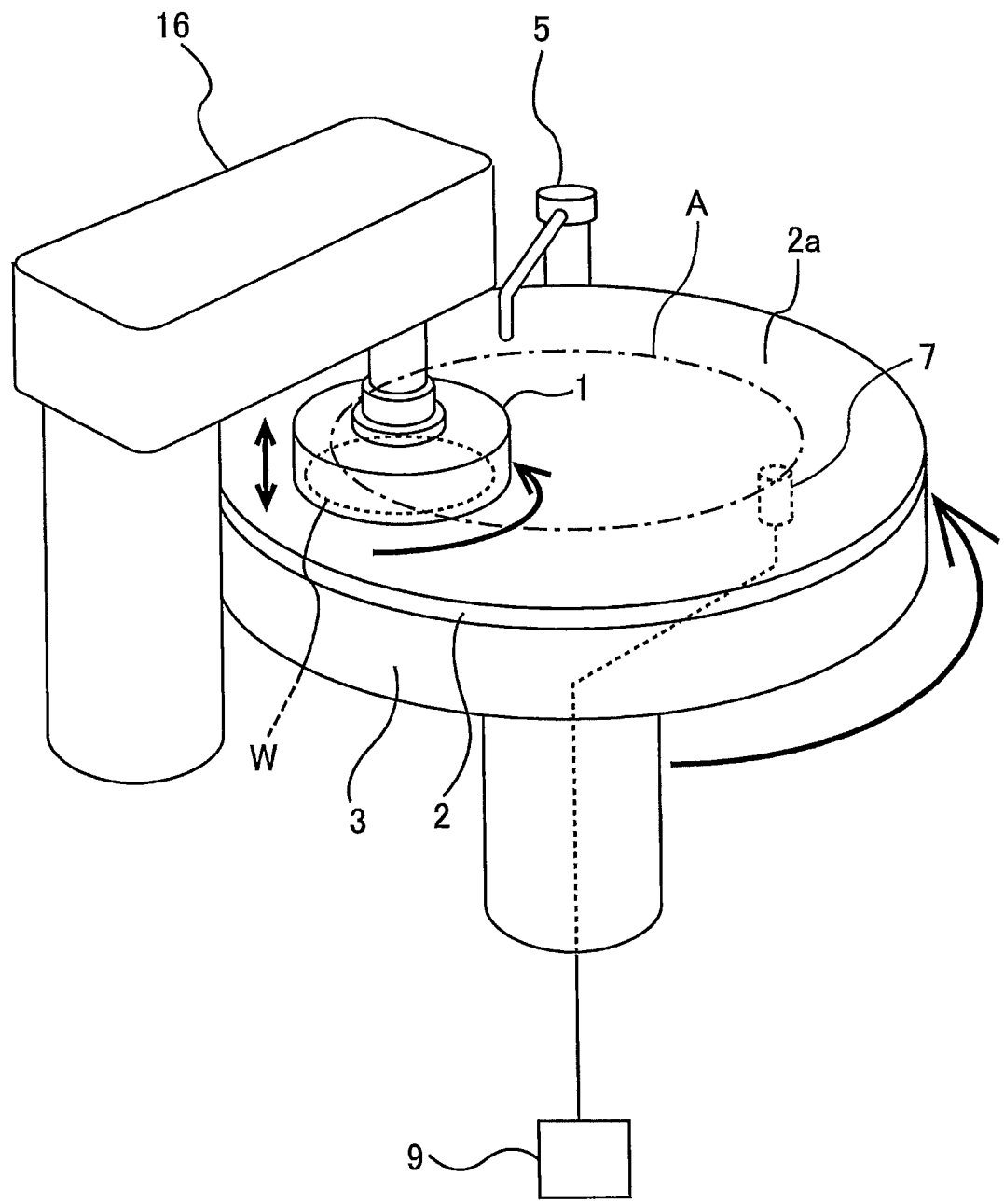
FIG. 1 is a schematic view of a polishing apparatus according to an embodiment.

Embodiments will be described in detail below with reference to the drawings. Identical or corresponding elements are denoted by the same reference numerals throughout the drawings and their repetitive explanations will be omitted.

FIG. 1 is a schematic view of a polishing apparatus according to an embodiment. As shown in FIG. 1, the polishing apparatus includes a polishing head (or a substrate holder) 1 for holding and rotating a wafer W which is an example of a substrate, a polishing table 3 for supporting a polishing pad 2 thereon, and a polishing liquid supply nozzle 5 for supplying a polishing liquid (or slurry) onto the polishing pad 2.

The polishing head 1 is configured to hold the wafer W on its lower surface by vacuum suction. The polishing head 1 and the polishing table 3 rotate in the same direction as indicated by arrows. In this state, the polishing head 1 presses the wafer W against a polishing surface 2a of the polishing pad 2. The polishing liquid is supplied from the polishing liquid supply nozzle 5 onto the polishing pad 2, so that the wafer W is polished by sliding contact with the polishing pad 2 in the presence of the polishing liquid.

The polishing apparatus further includes a film thickness sensor 7 for obtaining a film thickness signal that varies according to a film thickness of the wafer W. The film thickness sensor 7 is disposed in the polishing table 3 and obtains the film thickness signal at multiple regions, including a central region, of the wafer W every time the polishing table 3 makes one revolution. Examples of the film thickness sensor 7 include an optical sensor and an eddy current sensor.

During polishing of the wafer W, the film thickness sensor 7 rotates together with the polishing table 3 and obtains the film thickness signal while sweeping across a surface of the wafer W as shown by a symbol A. This film thickness signal is an index value indicating the film thickness directly or indirectly, and varies in accordance with a decrease in the film thickness of the wafer W. The film thickness sensor 7 is coupled to a polishing controller 9 so that the film thickness signal is transmitted to the polishing controller 9. This polishing controller 9 is configured to terminate polishing of the wafer W when the film thickness of the wafer W, which is indicated by the film thickness signal, has reached a predetermined target value.

Figure 2:
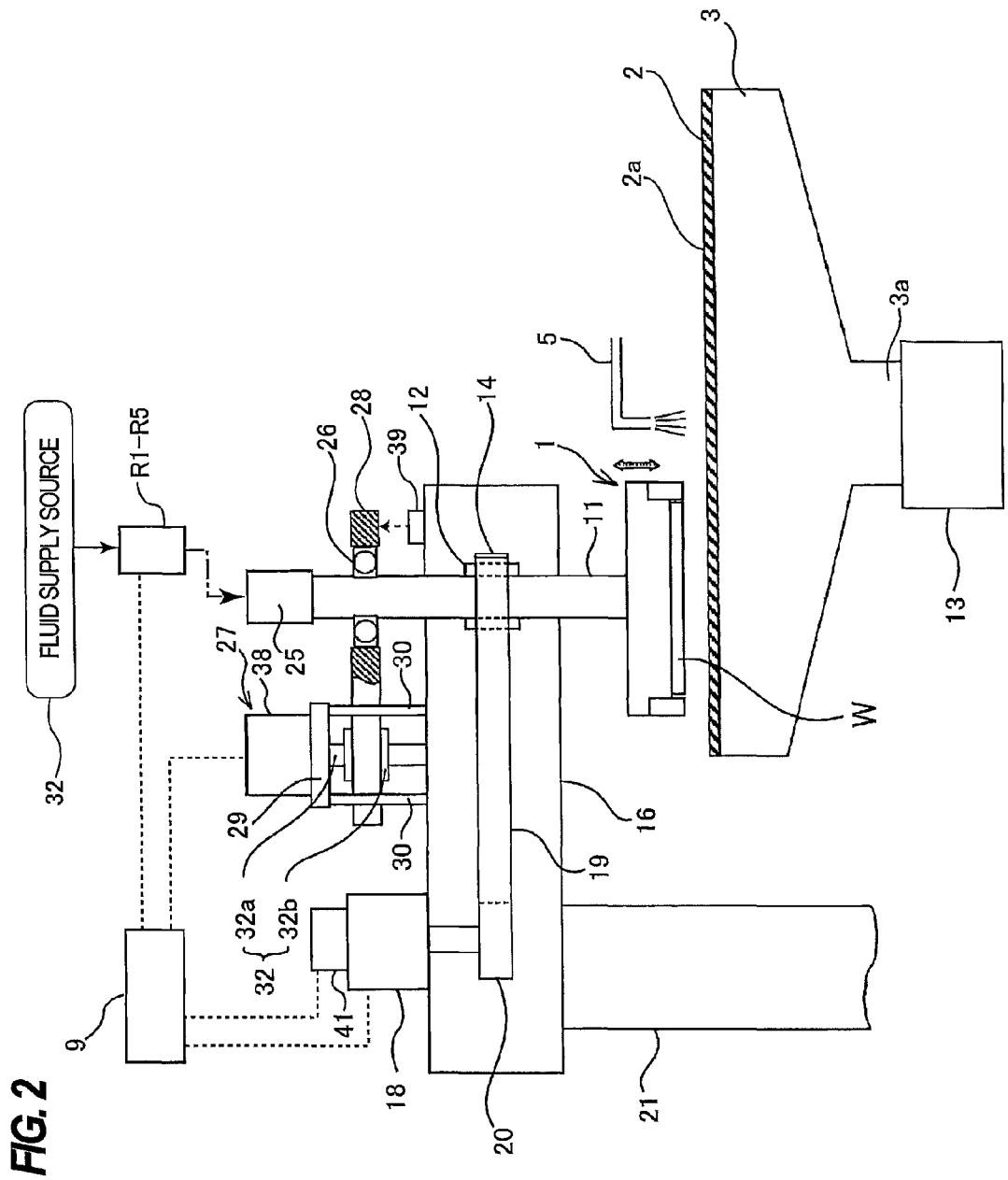
FIG. 2 is a view showing a detailed structure of the polishing apparatus.

FIG. 2 is a view showing a detailed structure of the polishing apparatus. The polishing table 3 is coupled to a table motor 13 through a table shaft 3a and is rotated about the table shaft 3a by the table motor 13 which is disposed below the polishing table 3. The polishing pad 2 is attached to an upper surface of the polishing table 3. An upper surface of the polishing pad 2 provides the polishing surface 2a for polishing the wafer W. When the polishing table 3 is rotated by the table motor 13, the polishing surface 2a moves relative to the polishing head 1. Therefore, the table motor 13 serves as a polishing surface moving mechanism for moving the polishing surface 2a horizontally.

The polishing head 1 is coupled to a polishing head shaft 11, which is movable vertically relative to a head arm 16 by a vertically moving mechanism 27. A vertical movement and positioning of the entirety of the polishing head 1 with respect to the head arm 16 are achieved by the vertical movement of the polishing head shaft 11. A rotary joint 25 is mounted to an upper end of the polishing head shaft 11.

The vertically moving mechanism 27 for elevating and lowering the polishing head shaft 11 and the polishing head 1 includes a bridge 28 for rotatably supporting the polishing head shaft 11 through a bearing 26, a ball screw 32 mounted to the bridge 28, a support base 29 supported by pillars 30, and a servomotor 38 mounted to the support base 29. The support base 29 for supporting the servomotor 38 is secured to the head aim 16 through the pillars 30.

The ball screw 32 has a screw shaft 32a coupled to the servomotor 38 and a nut 32b which is in engagement with the screw shaft 32a. The polishing head shaft 11 is configured to move vertically together with the bridge 28. Therefore, when the servomotor 38 is set in motion, the bridge 28 moves vertically through the ball screw 32 to cause the polishing head shaft 11 and the polishing head 1 to move vertically. A polishing head height sensor 39, which is oriented toward the bridge 28, is secured to the head arm 16. This polishing head height sensor 39 is configured to measure a height of the polishing head 1 based on a position of the bridge 28 which moves vertically together with the polishing head 1.

The polishing head shaft 11 is further coupled to a rotary cylinder 12 through a key (not shown). This rotary cylinder 12 has a timing pulley 14 on its outer circumferential surface. A polishing head motor 18 is secured to the head arm 16, and the timing pulley 14 is coupled through a timing belt 19 to a timing pulley 20 which is secured to the polishing head motor 18. With these configurations, rotation of the polishing head motor 18 is transmitted to the rotary cylinder 12 and the polishing head shaft 11 through the timing pulley 20, the timing belt 19, and the timing pulley 14 to thereby rotate the rotary cylinder 12 and the polishing head shaft 11 together, thus rotating the polishing head 1 about its own axis. The polishing head motor 18, the timing pulley 20, the timing belt 19, and the timing pulley 14 constitute a rotating mechanism for rotating the polishing head 1 about its own axis. The head arm 16 is supported by an arm shaft 21 which is rotatably supported by a frame (not shown).

The polishing head 1 is configured to be able to hold the wafer W on its lower surface. The head arm 16 is configured to be able to pivot on the arm shaft 21, so that the polishing head 1, holding the wafer W on its lower surface, is moved from a transfer position of the wafer W to a position above the polishing table 3 by the pivotal movement of the head arm 16. The polishing head 1 and the polishing table 3 are rotated, while the polishing liquid is supplied onto the polishing pad 2 from the polishing liquid supply nozzle 5 disposed above the polishing table 3. The polishing head 1 presses the wafer W against the polishing surface 2a of the polishing pad 2 to bring the wafer W into sliding contact with the polishing surface 2a of the polishing pad 2 in the presence of the polishing liquid. The surface of the wafer W is polished by a chemical action of chemical components of the polishing liquid and a mechanical action of abrasive grains contained in the polishing liquid.

Figure 3:
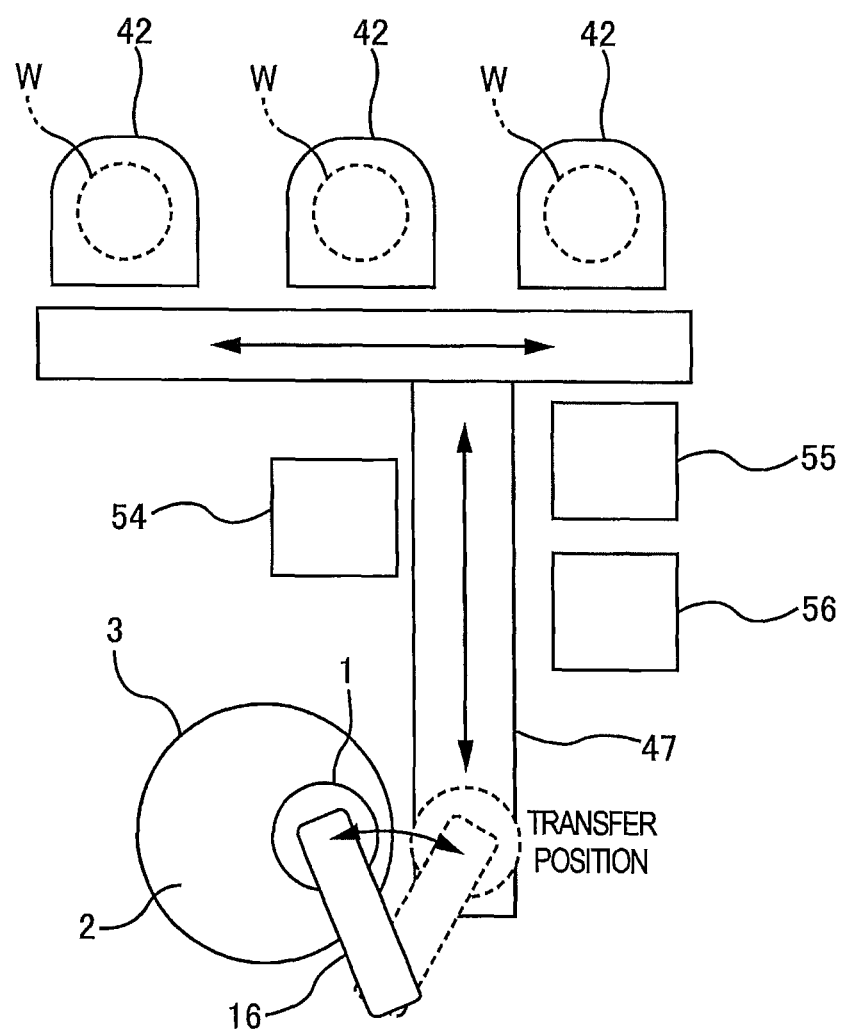
FIG. 3 is a schematic view of the polishing apparatus as viewed from above.

FIG. 3 is a schematic view of the polishing apparatus as viewed from above. As shown in FIG. 3, FOUPs 42, each storing a plurality of wafers therein, are set on the polishing apparatus. The FOUP (Front-Opening Unified Pod) 42 is a transportable container which can house wafers therein. When the wafer W is introduced into and carried out of the polishing apparatus, the wafer W is housed in the FOUP 42. Typically, as shown in FIG. 3, the plurality of FOUPs 42 are set on the polishing apparatus. Each one of the FOUPs 42 can house up to 25 wafers.

The polishing apparatus includes a transporter 47 which transports the wafer W between the FOUPs (transportable container) 42 and the polishing head 1. The transporter 47 is configured to be able to transport the wafer W in directions indicated by arrows. More specifically, the transporter 47 is configured to take one wafer W out of one of the FOUPs 42, and transport the wafer W to the transfer position beside the polishing table 3. The transporter 47 is constructed by a combination of a transfer robot, a linear transporter for moving the wafer W horizontally, and a pusher for moving the wafer W vertically, and other devices. However, the transporter 47 is not limited to such a structure.

As described above, the polishing head 1 is configured to be movable between the transfer position and the position above the polishing table 3 by the pivotal movement of the head arm 16. The polishing head 1 receives the wafer W from the transporter 47 at the transfer position, and holds the wafer W on its lower surface. The polishing head 1 moves together with the wafer W to the position above the polishing table 3, and then presses the wafer W against the polishing pad 2 on the polishing table 3.

A reversing machine 54, a notch detector 55, and a film thickness measuring device 56 are disposed along the transporter 47. In FIG. 3, the notch detector 55 is arranged beside the film thickness measuring device 56. The notch detector 55 may be arranged above or below the film thickness measuring device 56. The transporter 47 is configured to be able to transport the wafer W to the reversing machine 54, the notch detector 55, and the film thickness measuring device 56.

The reversing machine 54 is a device for reversing (or turning over) the wafer W. The wafer W is housed in the FOUP 42 with its surface, to be polished, facing upwardly. Therefore, the wafer W is reversed by the reversing machine 54 so that the surface, to be polished, of the wafer W faces downwardly, in order for the polishing head 1 to be able to press the surface of the wafer W against the polishing surface 2a which is constituted by the upper surface of the polishing pad 2. The notch detector 55 is a device for detecting a notch formed in a peripheral portion of the wafer W. The notch is a cutout indicating an orientation of the wafer W with respect to the circumferential direction of the wafer W. The film thickness measuring device 56 is an inline-type film thickness measuring device which is configured to measure a film thickness of the wafer.

Figure 4:
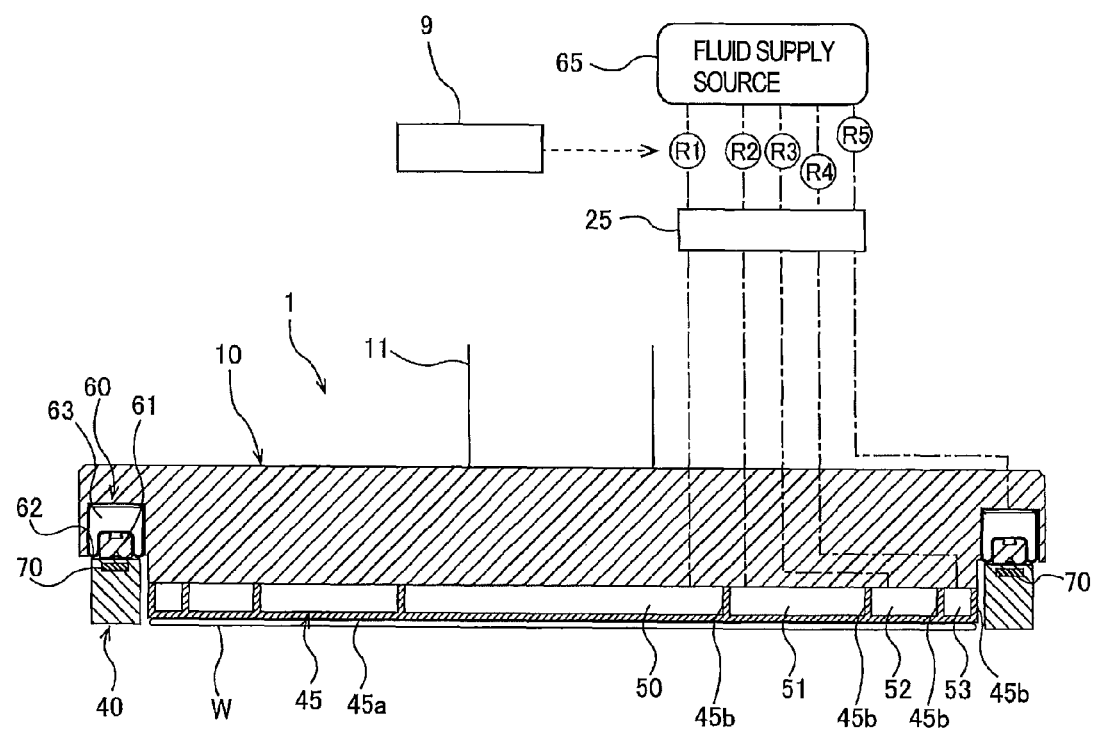
FIG. 4 is a sectional view of a polishing head.

Next, the polishing head 1 serving as the substrate holder will be described. FIG. 4 is a sectional view of the polishing head 1. As shown in FIG. 4, the polishing head 1 includes a head body 10 for pressing the wafer W against the polishing surface 2a, and a retainer ring 40 which is arranged so as to surround the wafer W. The head body 10 and the retainer ring 40 are configured to rotate together by the rotation of the polishing head shaft 11. The retainer ring 40 is configured to be movable independently of the head body 10 in the vertical directions.

An elastic membrane 45, which is brought into contact with a back surface of the wafer W, is attached to a lower surface of the head body 10. The elastic membrane 45 has a lower surface which constitutes a pressing surface 45a for pressing the wafer W against the polishing surface 2a. The elastic membrane 45 has a plurality of annular partition walls 45b defining four pressure chambers, i.e., a central pressure chamber 50, a ripple pressure chamber 51, an outer pressure chamber 52, and an edge pressure chamber 53, which are located between the elastic membrane 45 and the head body 10. The central pressure chamber 50 has a circular shape. Each of the ripple pressure chamber 51, the outer pressure chamber 52, and the edge pressure chamber 53 has an annular shape. The central pressure chamber 50, the ripple pressure chamber 51, the outer pressure chamber 52, and the edge pressure chamber 53 are concentrically arranged. In this embodiment, the four pressure chambers are formed between the elastic membrane 45 and the head body 10, but the number of pressure chambers may be more than four, or less than four.

The pressure chambers 50 to 53 are coupled to a fluid supply source 65 via the rotary joint 25 and pressure regulators R1 to R4, so that a pressurized fluid is supplied from the fluid supply source 65 into the pressure chambers 50 to 53. The pressure regulators R1 to R4 are configured to be able to independently regulate pressures in the four pressure chambers 50 to 53. The pressure chambers 50 to 53 are further coupled to a not-illustrated vacuum source (e.g., vacuum pump) for producing negative pressure in the pressure chambers 50 to 53. The elastic membrane 45 has a through-hole (not shown) at a position corresponding to a position of the ripple pressure chamber 51 or the outer pressure chamber 52, so that the elastic membrane 45 can hold the substrate W on its pressing surface 45a when the negative pressure is developed in the through-hole.

The central pressure chamber 50, the ripple pressure chamber 51, the outer pressure chamber 52, and the edge pressure chamber 53 are further coupled to vent mechanisms (not shown), respectively, so that the central pressure chamber 50, the ripple pressure chamber 51, the outer pressure chamber 52, and the edge pressure chamber 53 can be ventilated to the atmosphere.

The retainer ring 40 is disposed so as to surround the elastic membrane 45 and the wafer W, and retains the wafer W so as to prevent the wafer W from being separated from the polishing head 1 during polishing of the wafer W. The retainer ring 40 has an upper portion coupled to a retainer-ring pressing mechanism 60, which is in an annular shape and is configured to exert a uniform downward load on an entirety of an upper surface of the retainer ring 40 to thereby press an entirety of a lower surface of the retainer ring 40 against the polishing surface 2a of the polishing pad 2.

The retainer-ring pressing mechanism 60 includes an annular piston 61 fixed to the upper portion of the retainer ring 40, and an annular rolling diaphragm 62 coupled to an upper surface of the piston 61. An annular retainer-ring pressure chamber 63 is formed in the rolling diaphragm 62. The retainer-ring pressure chamber 63 is coupled to the fluid supply source 65 via the rotary joint 25 and a pressure regulator R5.

When the pressurized fluid (e.g., pressurized air) is supplied from the fluid supply source 65 into the retainer-ring pressure chamber 63, the rolling diaphragm 62 pushes down the piston 61, which pushes down the entirety of the retainer ring 40. In this manner, the retainer-ring pressing mechanism 60 presses the entirety of the lower surface of the retainer ring 40 against the polishing surface 2a of the polishing pad 2. The pressure in the retainer-ring pressure chamber 63 is regulated by the pressure regulator R5.

The retainer-ring pressure chamber 63 is further coupled to the not-illustrated vacuum source (e.g., vacuum pump) for producing negative pressure in the retainer-ring pressure chamber 63. When negative pressure is developed in the retainer-ring pressure chamber 63, the entirety of the retainer ring 40 is elevated. The retainer-ring pressure chamber 63 is further coupled to a vent mechanism (not shown), so that the retaining pressure chamber 63 can be ventilated to the atmosphere.

The pressure regulators R1 to R5 are coupled to the polishing controller 9, and operations of the pressure regulators R1 to R5 are controlled by the polishing controller 9.

The retainer ring 40 is removably coupled to the retainer-ring pressing mechanism 60. More specifically, the piston 61 is made of a magnetic material, such as metal, and a plurality of magnets 70 are disposed on the upper portion of the retainer ring 40. These magnets 70 attract the piston 61, thereby securing the retainer ring 40 to the piston 61 via a magnetic force.

A difference in a relative angle between the wafer W and the polishing head 1 during polishing is desirably not more than 45 degrees, and more desirably not more than 20 degrees. Therefore, the elastic membrane 45 is formed of a rubber material which has an excellent capacity of holding a wafer. Specifically, the elastic membrane 45 is formed of a highly strong and durable rubber material, such as silicone rubber, ethylene propylene rubber (EPDM), polyurethane rubber, or the like. The use of the elastic membrane 45 formed of such a material enables the wafer W and the polishing head 1 to rotate together during polishing of the wafer W.

An interior space of the elastic membrane 45 is divided by the annular partition walls 45*b* into the multiple pressure chambers 50, 51, 52, 53 arranged along the radial direction of the wafer W, while the interior space is not divided in the circumferential direction of the wafer W. Therefore, each of the pressure chambers 50, 51, 52, 53 can apply a pressing force, which is uniform in the circumferential direction of the wafer W, to the wafer W. The retainer ring 40 is pressed against the polishing pad 2 by the retainer-ring pressing mechanism 60, which extends in the circumferential direction of the wafer W and applies to the retainer ring 40 a pressing force which is uniform in the circumferential direction.

Figure 5A:
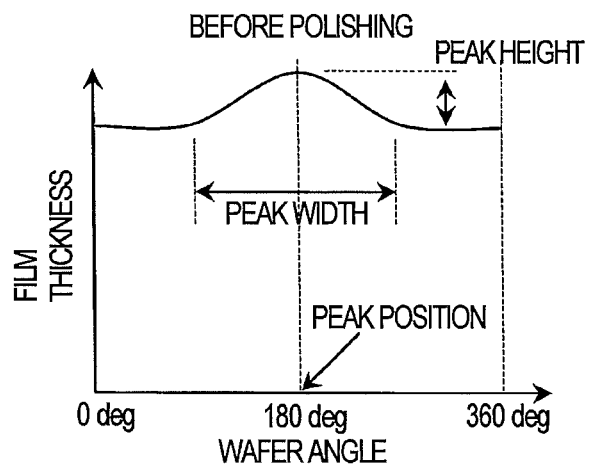
FIG. 5A, FIG. 5B, and FIG. 5C are views each showing an example of a film-thickness distribution along a circumferential direction of a wafer in a region located inwardly from an outermost edge of the wafer by a distance of 3 mm.
Figure 5B:
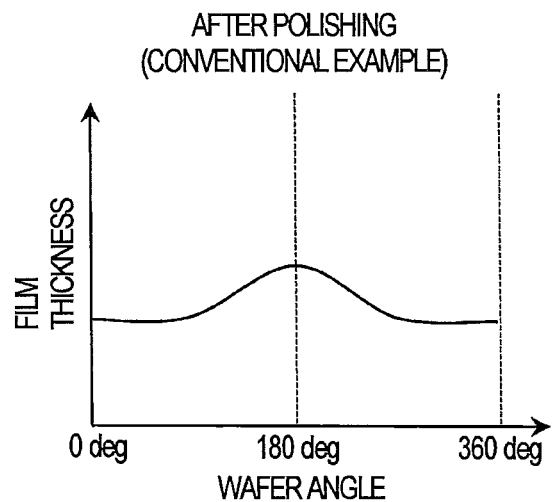
Figure 5C:
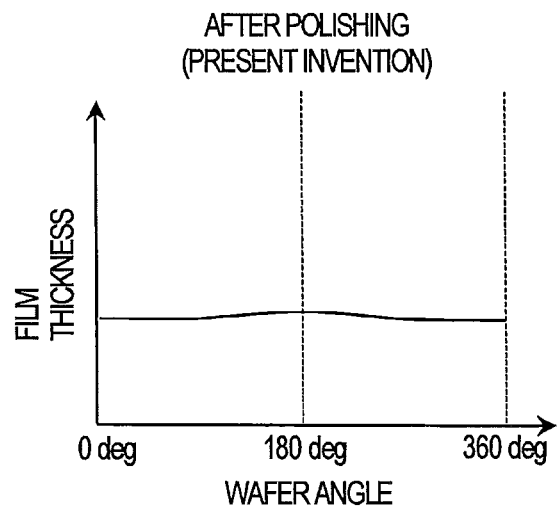

FIG. 5A, FIG. 5B, and FIG. 5C are views each showing an example of a film-thickness distribution along a circumferential direction of a wafer W in a region located inwardly from an outermost edge of the wafer W by a distance of 3 mm. More specifically, FIG. 5A shows an initial film-thickness distribution before polishing of a wafer, FIG. 5B shows a film-thickness distribution of a wafer polished by a conventional polishing apparatus, and FIG. 5C shows an example of a film-thickness distribution of a wafer polished by the polishing apparatus according to the embodiment.

A variation in the film thickness along the circumferential direction of the wafer is likely to raise a problem in a subsequent device manufacturing process. In general, the variation in the film thickness in a region located inwardly from the outermost edge of the wafer W by a distance of 3 mm to 5 mm can often be problematic. A position of a wafer angle of 0 degrees in FIGS. 5A to 5C is set to a position of a distinctive portion which can specify an angle (or orientation) of the wafer in its circumferential direction. In the examples shown in FIGS. 5A to 5C, the position of the wafer angle of 0 degrees is a position of the notch formed in the peripheral portion of the wafer.

In the example shown in FIG. 5A, the initial film-thickness distribution before polishing shows a variation in the film thickness which has a peak position at the wafer angle of 180 degrees with a certain peak width and a certain peak height. Possible causes of such initial film-thickness distribution include a characteristic of a film-forming device and influences of various processes for forming multilayer interconnects.

In the case where a wafer, which has the initial film-thickness distribution shown in FIG. 5A, is polished by the conventional polishing apparatus, polishing progresses almost uniformly in the circumferential direction. As a result, as shown in FIG. 5B, the polished wafer still has a film-thickness distribution that is almost the same as that before polishing. The variation in the film-thickness distribution can cause out of focus in the next exposure process, and as a result, a yield of a semiconductor manufacture may be lowered.

As shown in FIG. 5C, in the case where a wafer, which has the initial film-thickness distribution shown in FIG. 5A, is polished by the polishing apparatus according to embodiments described below, the variation in the film thickness in the circumferential direction can be reduced as compared to the initial film-thickness distribution, because the polishing apparatus according to the embodiments can increase the polishing rate selectively at the peak position.

Figure 6:
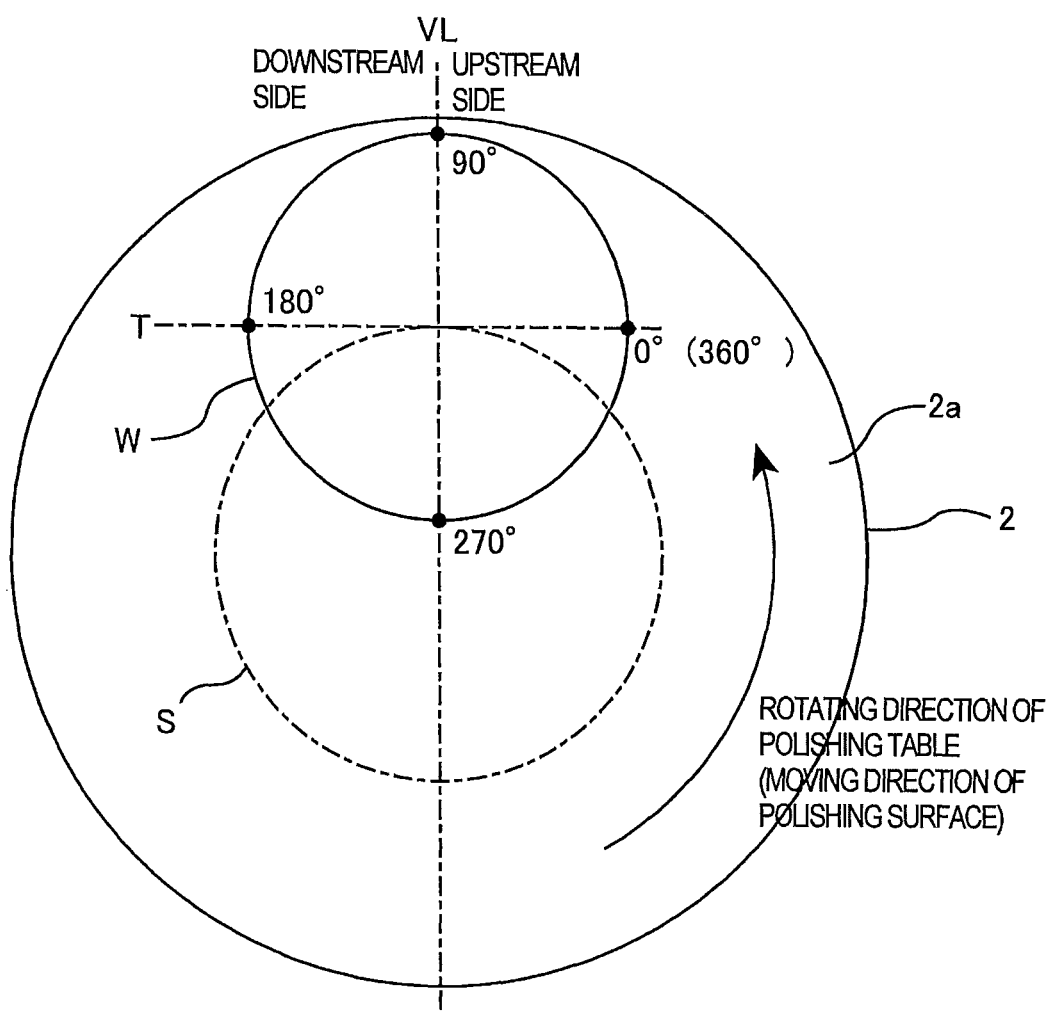
FIG. 6 is a view showing a positional relationship as viewed from above a polishing surface.

Next, embodiments, which can improve the variation in the film thickness in the circumferential direction of the wafer by controlling a polishing-rate distribution in the circumferential direction of the wafer, will be described. FIG. 6 is a view showing a positional relationship as viewed from above the polishing surface 2*a*. In FIG. 6, a line interconnecting the center of the wafer W and the center of the polishing surface 2*a* is defined as an imaginary line VL. The polishing surface 2*a* can be divided into a region upstream of the imaginary line VL and a region downstream of the imaginary line VL with respect to the rotating direction of the polishing surface 2*a*. Stated otherwise, the region upstream of the imaginary line VL and the region downstream of the imaginary line VL are an upstream side of the wafer W and a downstream side of the wafer W with respect to the moving direction of the polishing surface 2*a*.

In FIG. 6, a circle S represents a path of a point on the polishing surface 2*a* passing through the center of the wafer W as the polishing surface 2*a* rotates about its central axis. A line T, which is tangential to the circle S at the center of the wafer W, intersects with a wafer circle at two points. One of the two points lying at the upstream side is defined as a polishing-head angle of 0 degrees, and the other lying at the downstream side is defined as a polishing-head angle of 180 degrees. The imaginary line VL intersects with the wafer circle at two points. One of the two points which is near the center of the polishing surface is defined as a polishing-head angle of 270 degrees, and the other which is near a peripheral edge of the polishing surface is defined as a polishing-head angle of 90 degrees. The wafer circle represents the outermost edge of the wafer W.

During polishing of the wafer W, the wafer W receives a frictional force from the polishing surface 2*a*, and therefore the peripheral portion of the wafer W is pressed against an inner circumferential surface of the retainer ring 40. Since the frictional force is applied to substantially one point of the retainer ring 40, the retainer ring 40 is locally deformed such that a part of the retainer ring 40 is forced to expand outwardly. Therefore, the retainer ring 40 may act so as to thrust the peripheral portion of the wafer W into the polishing pad 2. As a result, a downstream-side portion of the wafer W is polished at a polishing rate higher than that in other portions. The wafer W is also deformed by being pressed against the retainer ring 40, and a contact pressure between the downstream-side portion of the wafer W and the polishing pad 2 increases locally. As a result, the downstream-side portion of the wafer W is polished at a polishing rate higher than that in other portions.

In this manner, the wafer W is not uniformly polished over its entirety, and is polished with different polishing rates. In contrast to the above-described example, there may be a case where an upstream-side portion of the wafer W (or a portion near the center of the polishing surface depending on a supply position of the polishing liquid), onto which the polishing liquid flows, is polished at a polishing rate higher than that in the downstream-side portion of the wafer W.

Figure 7:
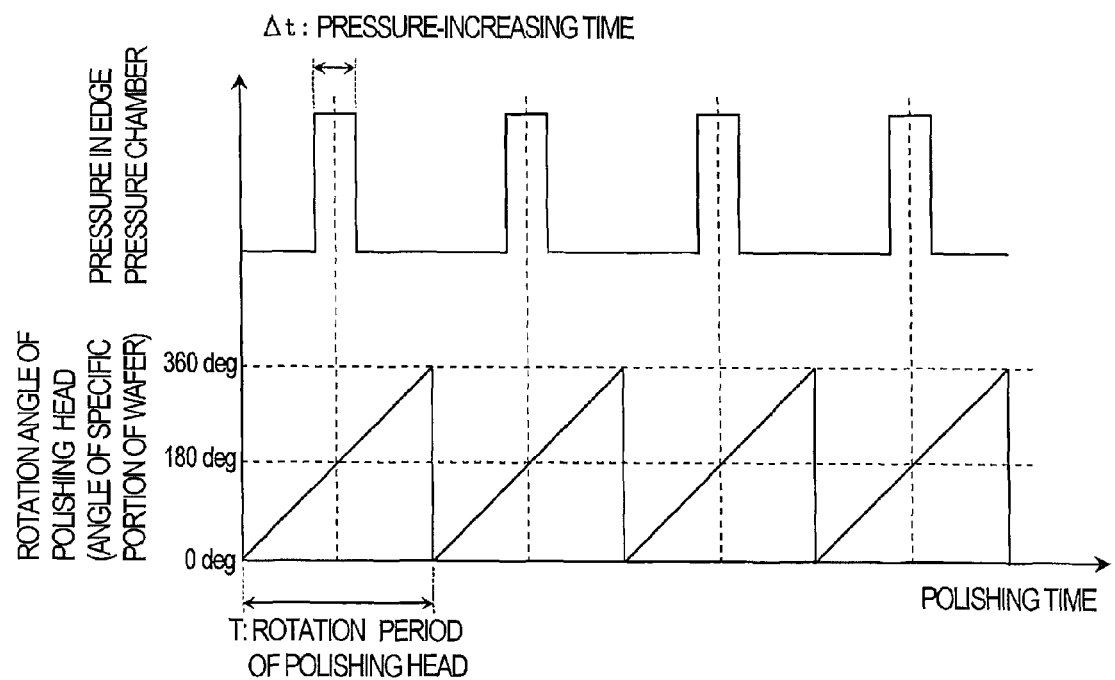
FIG. 7 is a view showing an embodiment of a polishing method using the above-described polishing apparatus.

FIG. 7 shows an embodiment of a polishing method using the above-described polishing apparatus. A horizontal axis represents a polishing time, and a vertical axis represents the polishing-head angle, the wafer angle, and the pressure in the edge pressure chamber 53 that presses the peripheral portion of the wafer W. In this embodiment, a polishing condition is represented by the pressure in the edge pressure chamber 53. Instead, the polishing condition may be represented by the pressure in any one of the other pressure chambers 50 to 52 or the pressure in the retainer-ring pressure chamber 63.

With the elapse of the polishing time, the polishing-head angle changes in order of 0 degrees, 180 degrees, and 360 degrees (=0 degrees). The rotation of the polishing head 1 is repeated with a period T. In a conventional polishing apparatus (not shown), a wafer W is polished with a constant pressure kept in the edge pressure chamber 53. In the polishing apparatus according to the embodiment, the pressure in the edge pressure chamber 53 is increased when a thick-film portion of the wafer (in FIG. 5A, a portion of the wafer at the wafer angle of 180 degrees) is located at the polishing-head angle of 180 degrees. This pressure-increasing time is represented by a symbol Δt.

In the example shown in FIG. 7, the polishing rate becomes high at the polishing-head angle of 180 degrees. Therefore, when the thick-film portion of the wafer is located at the polishing-head angle of 180 degrees, the pressure in the entirety of the edge pressure chamber 53 is temporarily increased to thereby selectively increase the polishing rate of the thick-film portion of the wafer. This operation is performed several times or continually during a total polishing time, thereby improving a uniformity of the film-thickness distribution in the circumferential direction of the polished wafer. When the pressure in the edge pressure chamber 53 in its entirety is temporarily increased, the polishing rate in other wafer portions (e.g., a portion at the angle of 0 degrees) is also increased. However, since the polishing rate is originally high at the polishing-head angle of 180 degrees, an amount of material removed is increased at the polishing-head angle of 180 degrees as compared with other angles. Therefore, it is possible to improve the uniformity of the film-thickness distribution in the circumferential direction of the wafer.

In contrast to the above-described example, it is also possible to selectively decrease a polishing rate in a thin-film portion of the wafer (a portion at the wafer angle of 0 degrees) by temporarily decreasing the pressure in the entirety of the edge pressure chamber 53 when the thin-film portion is located at the polishing-head angle of 180 degrees. It is also possible to combine the above-described two operations for the pressure in order to more efficiently improve the uniformity of the film-thickness distribution in the circumferential direction.

In a case where a peak shape of the film thickness shown in FIG. 5A is approximately symmetrical with respect to the peak position, the pressure-increasing time Δt in FIG. 7 may be established by two equal times, one of which is a time before the polishing-head angle of 180 degrees, and other is a time after the polishing-head angle of 180 degrees. In a case where the peak position does not coincide with a center of the peak width, e.g., in a case where an angle of the center of the peak width is smaller than that of the peak position, it is necessary to more positively polish a region in an angle that is smaller than the angle of the peak position. Therefore, in that case, the center of the pressure-increasing time Δt is set to a time before a time at which the wafer angle is 180 degrees.

The pressure-increasing time may be changed in accordance with the peak width, or an increment of the pressure in the edge pressure chamber 53 may be changed in accordance with the peak height. Specifically, the pressure-increasing time may be increased in accordance with the peak width, or the increment of the pressure in the pressure chamber 53 may be increased in accordance with the peak height. In the example shown in FIG. 7, the pressure in the pressure chamber 53 is changed in a square wave fashion. The pressure may be changed in a stepwise fashion, or may be changed in an oblique line or in a curved line.

In the example shown in FIG. 7, only the pressure in the edge pressure chamber 53 located at an outermost circumference of the elastic membrane 45 is changed. In one embodiment, a pressure in the pressure chamber located more inwardly than the edge pressure chamber 53 may be changed, or the pressures in the pressure chambers may be changed simultaneously. For example, the pressures in the edge pressure chamber 53 and the outer pressure chamber 52 may be changed simultaneously. In this case, the pressures, to be changed, in the pressure chambers may be different or may be the same.

In general, when the pressure applied to the retainer ring 40 is increased, the polishing rate is increased in a region extending inwardly from the outermost edge of the wafer by a distance of 3 mm to 5 mm. Further, when the polishing head 1 is elevated, the polishing rate is decreased in a region extending inwardly from the outermost edge of the wafer by the distance of 3 mm to 5 mm, because of an increase in loss due to an expansion of the elastic membrane 45. Thus, the pressure applied to the retainer ring 40 may be periodically increased, instead of periodically increasing the pressure in the edge pressure chamber 53 in synchronization with the rotation angle of the polishing head 1 in FIG. 7. Alternatively, the height of the polishing head 1 may be periodically lowered. The pressure to be applied to the retainer ring 40 can be changed by changing the pressure in the retainer-ring pressure chamber 63 in its entirety of the retainer-ring pressing mechanism 60. The height of the polishing head 1 can be changed by the vertically moving mechanism 27 shown in FIG. 2.

A response of the polishing rate to a change in each parameter (e.g., the pressure in the edge pressure chamber 53 or the pressure on the retainer ring 40) for changing the polishing rate varies depending on a process. Therefore, a parameter that is different from the above-described embodiments may be changed. For example, in a case of a process in which the polishing rate is decreased in the region extending inwardly from the outermost edge of the wafer by the distance of 3 mm to 5 mm when the pressure on the retainer ring 40 is increased, an operation of decreasing the pressure on the retainer ring 40 is performed instead of increasing the pressure in the edge pressure chamber 53.

Figure 8:
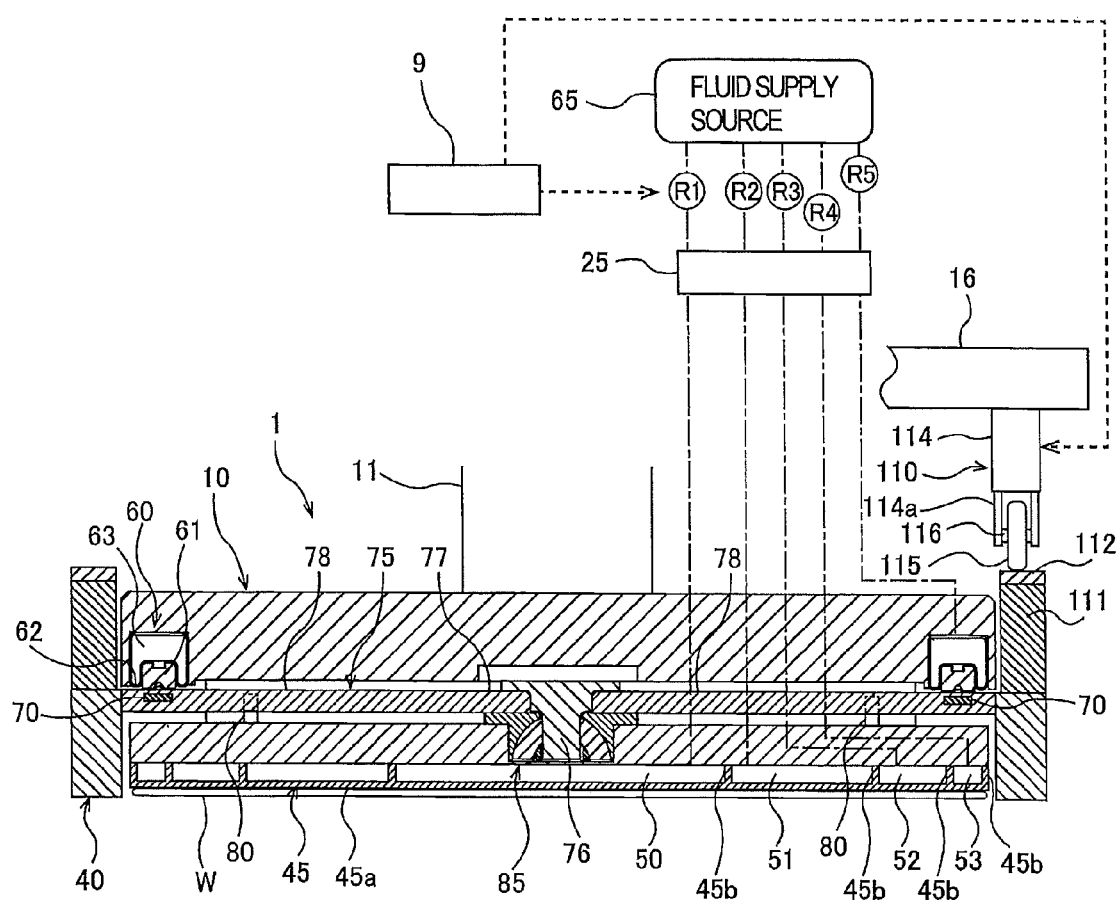
FIG. 8 is a view showing another embodiment of the polishing apparatus.

FIG. 8 shows another embodiment of the polishing apparatus. The polishing head 1 shown in FIG. 8 has a spherical bearing 85 which tiltably supports the retainer ring 40. The retainer ring 40 is coupled to the spherical bearing 85 through a coupling member 75. The coupling member 75 includes a shaft portion 76 arranged in the center of the head body 10, a hub 77 secured to the shaft portion 76, and a plurality of spokes 78 extending radially from the hub 77.

One ends of the spokes 78 are secured to the hub 77, and other ends of the spokes 78 are secured to the retainer ring 40. The hub 77 and the spokes 78 are formed integrally. Plural pairs of drive collars 80 are disposed in the head body 10. Each pair of drive collars 80 are arranged on both sides of each spoke 78. The rotation of the head body 10 is transmitted to the retainer ring 40 through the drive collars 80, so that the head body 10 and the retainer ring 40 rotate together.

The spherical bearing 85 is located inside the retainer ring 40. The shaft portion 76 of the coupling member 75 is supported by the spherical bearing 85, which is arranged at the center of the head body 10, such that the shaft portion 76 can move in the vertical direction. With these structures, the coupling member 75 and the retainer ring 40 secured to the coupling member 75 are movable in the vertical direction with respect to the head body 10. Further, the retainer ring 40 is tiltably supported by the spherical bearing 85. The retainer ring 40 is not substantially permitted to move in a lateral direction, and the position of the retainer ring 40 in the lateral direction (or horizontal direction) is fixed by the spherical bearing 85.

Figure 9:
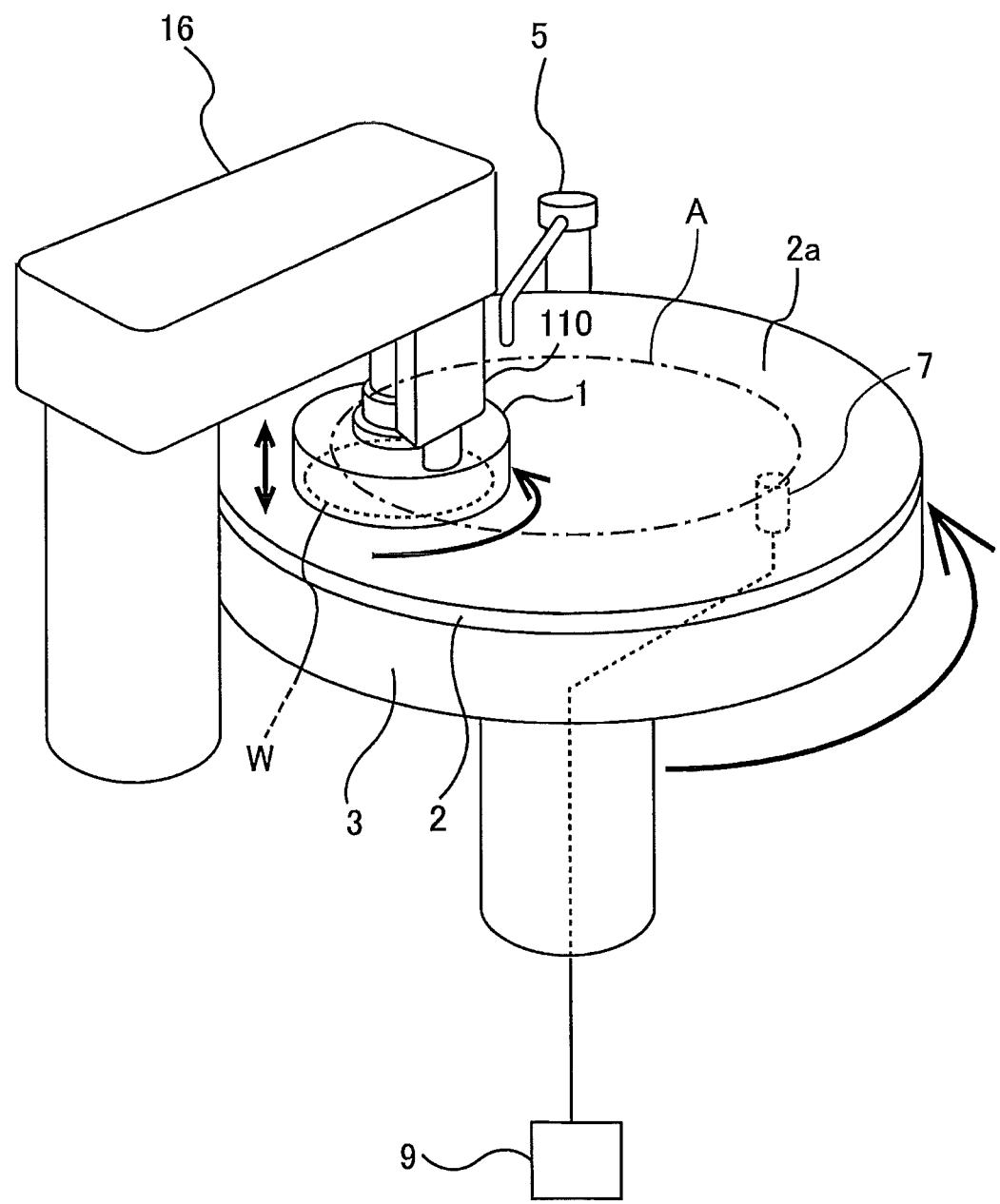
FIG. 9 is a perspective view schematically showing the polishing apparatus shown in FIG. 8.

The retainer ring 40 has an upper surface projecting radially outwardly from the head body 10. A local-load exerting device 110, which applies a downward local load to a part of the retainer ring 40, is arranged above the retainer ring 40. FIG. 9 shows a location of the local-load exerting device 110. As shown in FIG. 9, the local-load exerting device 110 is secured to the head arm 16, and is arranged downstream of the wafer W with respect to the rotating direction (i.e., the moving direction) of the polishing pad 2. During polishing, the retainer ring 40 rotates about its own axis, while the local-load exerting device 110 does not rotate with the retainer ring 40 and the position of the local-load exerting device 110 is fixed.

Referring back to FIG. 8, an embodiment of the local-load exerting device 110 will be described. As shown in FIG. 8, a load transmitting member 111 is fixed to the upper surface of the peripheral portion of the retainer ring 40. A guide ring 112 is secured to an upper portion of the load transmitting member 111. The local-load exerting device 110 exerts the downward local load on a part of the retainer ring 40 through the guide ring 112 and the load transmitting member 111. The load transmitting member 111 may have a ring shape or may comprise a plurality of columns arranged along a circumferential direction of the retainer ring 40.

The downward local load generated by the local-load exerting device 110 is transmitted from the guide ring 112 through the load transmitting member 111 to a part of the retainer ring 40. An operation of the local-load exerting device 110 is controlled by the polishing controller 9. The load transmitting member 111 and the guide ring 112 may be omitted so that the local-load exerting device 110 directly exerts the downward local load on the retainer ring 40.

The polishing head 1 rotates about its own axis, while the local-load exerting device 110 does not rotate with the polishing head 1, because the local-load exerting device 110 is secured to the head arm 16. Specifically, during polishing of the wafer W, the polishing head 1 and the wafer W rotate about their own axes, while the local-load exerting device 110 is stationary at a predetermined position.

The local-load exerting device 110 basically includes an air cylinder 114 and a wheel 115 coupled to a piston 114a of the air cylinder 114. The air cylinder 114 is fixed to the head arm 16. The wheel 115 is mounted to a distal end of the piston 114a. When the wheel 115 is lowered by the air cylinder 114, the wheel 115 applies the load to the guide ring 112. It is possible to change the load applied from the wheel 115 to the retainer ring 40 by changing a pressure of a gas supplied into the air cylinder 114.

The wheel 115 is rotatably supported by a non-rotatable wheel shaft 116 disposed centrally, and can rotate about the wheel shaft 116. The wheel 115 is formed of a material having a low coefficient of friction. A bearing, such as a ball bearing, may be interposed between the wheel shaft 116 and the wheel 115.

Figure 10:
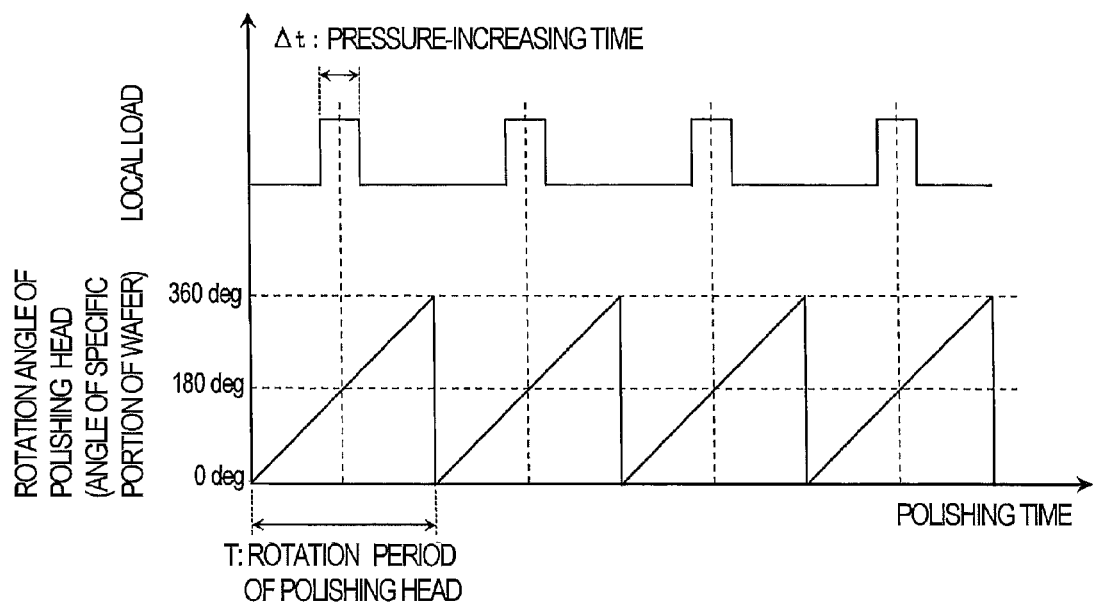
FIG. 10 is a view showing an embodiment of a polishing method using the above-described polishing apparatus.

As shown in FIG. 10, it is possible to improve the uniformity of the film-thickness distribution in the circumferential direction of the wafer by periodically changing the local load applied to the retainer ring 40 in synchronization with the rotation angle of the polishing head 1, instead of changing the pressure in the edge pressure chamber 53.

Figure 11:
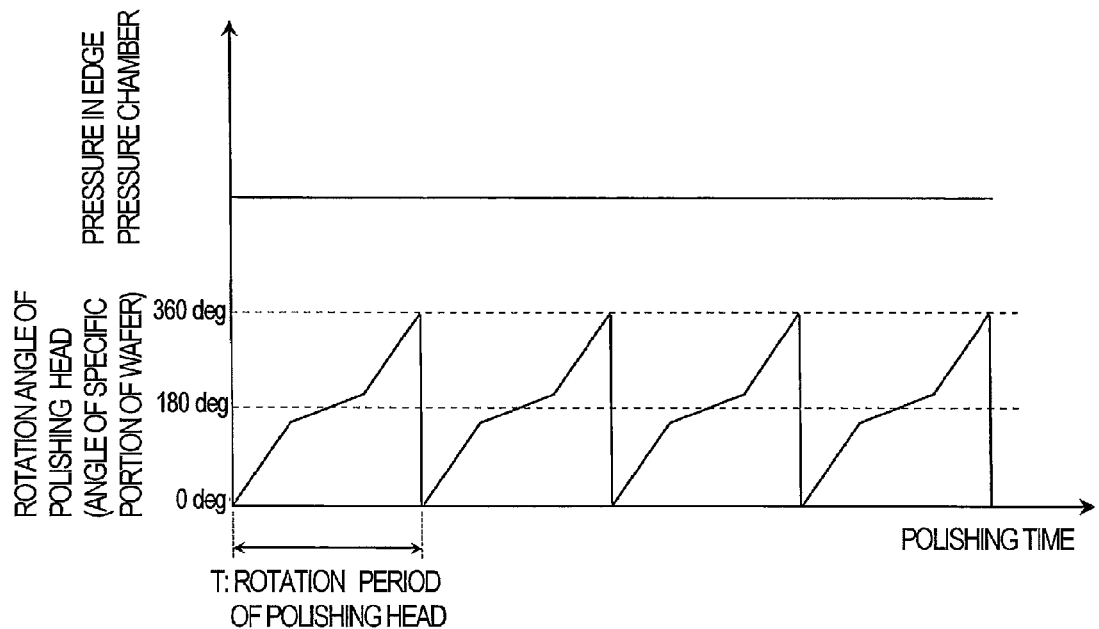
FIG. 11 is a view showing another embodiment in which an angular velocity of the polishing head is changed within one rotation period of the polishing head.

FIG. 11 shows another embodiment in which an angular velocity of the polishing head 1 is changed in one rotation period T of the polishing head 1. In this embodiment, the pressure in the edge pressure chamber 53 is not changed. Alternatively, the angular velocity of the polishing head 1 is temporarily decreased when the rotation angle of the polishing head 1 is 180 degrees. This operation can increase a time for which a thick-film portion of the wafer (a portion at the wafer angle of 180 degrees) stays at the polishing-head angle of 180 degrees, thereby increasing the polishing rate of the thick-film portion of the wafer. The polishing controller 9 operates the polishing head motor 18 shown in FIG. 2 so as to periodically change the angular velocity of the polishing head 1 in synchronization with the rotation angle of the polishing head 1. In this manner, it is possible to improve the uniformity of the film-thickness distribution in the circumferential direction of the wafer.

The example in FIG. 5A shows the case where the initial film-thickness distribution in the circumferential direction has one peak. Even in a case where a plurality of peaks exist, it is also possible to improve the uniformity of the film-thickness distribution in the circumferential direction of the wafer in the same way.

Next, a method of determining the relative angle between the wafer and the polishing head will be described with reference to a flow chart in FIG. 12. Each of a step A-1, a step A-2, and a step A-3 is a step of obtaining an angle of the notch which is a distinctive portion for specifying the angle (or orientation) of the wafer. The angle of the notch is an initial angle representing an orientation of the wafer before the wafer is held by the polishing head 1.

More specifically, in the step A-1, information about a position of the notch of the wafer is transmitted from a host computer to the polishing controller 9. The host computer is installed in a semiconductor manufacturing facility and is coupled to the polishing apparatus. As shown in FIG. 3, wafers, to be polished, are housed in the FOUP (transportable container) 42, and the FOUP 42, which houses the wafers therein, is set on the polishing apparatus. A relative position (angle) of the notch with respect to the FOUP 42 is inputted from the host computer into the polishing controller 9 via a communication device. The position (angle) of the notch may vary from wafer to wafer in the FOUP 42.

The step A-2 is different from the step A-1 in that wafers are housed in the FOUP 42, with their notches aligned in a predetermined position (angle). Generally, processes, such as a film-thickness measuring process and a defect inspection process, are performed before wafers are introduced into the polishing apparatus. These processes entail a notch alignment operation. Therefore, the notches of the wafers in the FOUP 42 have often been aligned in the same position (i.e., the same angle). In such a case, the FOUP 42 is set on the polishing apparatus in a state such that the notches of all wafers in the FOUP 42 are aligned in a predetermined same position (step A-2). The notch position can vary depending on a process. Therefore, even if notch positions are aligned in each one of FOUPs 42, notch positions may vary from FOUP to FOUP.

The step A-3 is a process of detecting the notch position of the wafer, and is different from the above-described steps A-1, A-2. In this step A-3, the notch position of the wafer is detected by the notch detector 55 (see FIG. 3), which is provided in the polishing apparatus, after the FOUP 42 housing the wafers therein is set on the polishing apparatus.

Next, information about a film thickness of a wafer to be polished is inputted into the polishing controller 9. In step B-1, the information about the film thickness of the wafer is inputted from the host computer of the semiconductor manufacturing facility into the polishing controller 9 in the same manner as in the step A-1. The information about the film thickness of the wafer includes the initial film-thickness distribution in the circumferential direction of the wafer, such as the peak position, the peak width, and the peak height. A polishing-condition changing time (e.g., the pressure-increasing time in the embodiment shown in FIG. 7) and a polishing-condition changing amount (e.g., the increment of the pressure in the embodiment shown in FIG. 7), both of which are required for eliminating the variation in the film thickness, may be determined based on this information. The polishing-condition changing time and the polishing-condition changing amount may be inputted from the host computer of the semiconductor manufacturing facility into the polishing controller 9.

Step B-2 is different from the step B-1 in that the polishing controller 9 uses information about a predetermined film thickness of the wafer to determine the polishing-condition changing time and the polishing-condition changing amount.

Step B-3 is different from the steps B-1, B-2 in that the film thickness of the wafer is measured by the film-thickness measuring device 56 (see FIG. 3) provided in the polishing apparatus, and the polishing controller 9 uses this film thickness information to determine the polishing-condition changing time and the polishing-condition changing amount.

The wafer is introduced into the polishing apparatus after a film-forming process is performed. Therefore, the wafer, to be polished, has a film-thickness distribution in the circumferential direction that can vary depending on a characteristic of a film-forming device, and there is a relatively small variation in the film-thickness distribution between wafers in the FOUP 42. Therefore, in such a case, a predetermined polishing-condition changing time and a predetermined polishing-condition changing amount may be used.

In step C, as shown in FIG. 3, the wafer that has been introduced into the polishing apparatus is transported to the transfer position by the transporter 47, and the wafer is transferred to the polishing head 1 at this transfer position. The position of the notch when the wafer is transported to the transfer position is known. The wafer is taken out from the FOUP 42 by the transporter 47, and is reversed by the reversing machine 54 such that a surface, to be polished, faces downwardly. The wafer is further transported to the transfer position by the transporter 47. These operations of transporting the wafer from the FOUP 42 to the transfer position are prescribed operations. Therefore, the polishing controller 9 can obtain (or predict) in advance the position of the notch when the wafer is transported to the transfer position. When the position of the notch is detected in the step A-3 before the wafer is reversed, the information of the notch position is handled in the same manner as in the step A-1 and the step A-2. On the other hand, if the notch position is detected after the wafer is reversed, the information of the notch position is handled in consideration of the change in the notch position of the wafer that has been reversed.

Before the polishing head 1 holds the wafer that has been transported to the transfer position, the polishing controller 9 obtains a current rotation angle of the polishing head 1, i.e., an initial rotation angle. The rotation angle of the polishing head 1 is detected by a rotary encoder 41 provided on the polishing head motor 18 illustrated in FIG. 2. The rotary encoder 41 is a rotation angle detector for detecting the rotation angle of the polishing head 1. The rotation angle detector is not limited to the rotary encoder as long as the rotation angle of the polishing head 1 can be detected.

Next, the polishing controller 9 causes the polishing head 1 to rotate until the initial rotation angle of the polishing head 1 coincides with the notch position (i.e., the initial angle) of the wafer at the transfer position (step D-1). Through this operation, the rotation angles of all wafers can coincide with the rotation angle of the polishing head 1. In the case where the above-described step D-1 is performed, the relative angle between the wafer and the polishing head 1 is 0 degrees. The initial rotation angle of the polishing head 1 may not necessarily coincide with the notch position of the wafer (step D-2). In this case, the polishing controller 9 determines the relative angle between the wafer and the polishing head 1 from a difference between the notch position (initial angle) of the wafer and the initial rotation angle of the polishing head 1.

In step E, the polishing head 1 holds the wafer, and the polishing controller 9 then calculates a relative angle between a thick-film portion of the wafer (i.e., the peak position in FIG. 5A) and the polishing head 1.

The wafer, held by the polishing head 1, is moved to the position above the polishing surface 2a of the polishing pad 2 by the polishing head 1, and is then pressed against the polishing surface 2a by the polishing head 1. The wafer is brought into sliding contact with the polishing surface 2a in the presence of the polishing liquid supplied from the polishing supply nozzle 5, so that the surface of the wafer is polished (step F). During polishing of the wafer, every time the peak position of the film-thickness distribution (i.e., the thick-film portion) is located at the polishing-head angle of 180 degrees, the polishing condition is periodically changed in accordance with the polishing-condition changing amount for only the polishing-condition changing time.

The pressures in the pressure chambers 50 to 53 are not very high at a moment the polishing head 1 is started to press the wafer against the polishing surface 2a of the polishing pad 2. Therefore, at this moment in time, the frictional force between the elastic membrane 45 of the polishing head 1 and the wafer is not large. As a result of this fact, the wafer may be slightly rotated with respect to the polishing head 1 by the rotating polishing surface 2a. In order to avoid this, the rotation of the polishing table 3 may be stopped, or may be rotated at a lower speed than that in a normal polishing operation when the polishing head 1 is started to press the wafer against the polishing surface 2a. A shift in wafer position in the rotating direction with respect to the polishing head 1 at the start of polishing does not vary under the same polishing condition. Therefore, the polishing condition may be changed with the rotation of the polishing head 1 in consideration of such a shift in wafer position that has been checked in advance.

During polishing of the wafer, the relative angle of the wafer with respect to the rotation angle of the polishing head 1 can slightly change. However, such a change in the relative angle is expected to be very small. Therefore, it is possible to reduce the variation in the film-thickness distribution of the wafer in its circumferential direction by changing the polishing condition in synchronization with the rotation angle of the polishing head 1, as discussed above.

In the above-described step B-1, step B-2, and step B-3, the polishing controller 9 obtains the information about the initial film thickness of the wafer, and determines the polishing-condition changing time and the polishing-condition changing amount before polishing of the wafer is started. Alternatively, the film thickness sensor 7, shown in FIG. 1, may be used to measure the film thickness at each rotation angle during polishing of the wafer. In this case, it is possible to change the polishing condition during polishing of the wafer based on measurement results, or stop the operation of changing the polishing condition if the variation in the film thickness in the circumferential direction is eliminated.

The polishing controller 9 can obtain the film-thickness distribution from film-thickness measurements obtained by the film thickness sensor 7 during polishing of the wafer, and can detect the change in the relative position (relative angle) between the wafer and the polishing head 1 from the change in the film-thickness distribution. Further, the polishing controller 9 may change the polishing condition in accordance with the change in the film-thickness distribution during polishing of the wafer.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus for polishing a substrate by bringing the substrate into sliding contact with a polishing surface, comprising:
    a polishing head including an elastic membrane for pressing the substrate against the polishing surface and a retainer ring arranged so as to surround the substrate, the retainer ring being capable of contacting the polishing surface;
    a rotating mechanism configured to rotate the polishing head about its own axis;
    a rotation angle detector configured to detect a rotation angle of the polishing head; and
    a polishing controller configured to periodically change a polishing condition of the substrate in synchronization with the rotation angle of the polishing head.

2. The polishing apparatus according to claim 1, wherein the polishing controller is configured to obtain an initial angle of the substrate indicating an orientation of the substrate with respect to a circumferential direction of the substrate before the substrate is held by the polishing head, and obtain an initial rotation angle of the polishing head before holding the substrate.

3. The polishing apparatus according to claim 2, wherein the polishing controller is configured to obtain the initial angle of the substrate from outside the polishing apparatus via a communication device.

4. The polishing apparatus according to claim 2, further comprising:
    a notch detector configured to detect a notch formed in the substrate,
    wherein the polishing controller is configured to obtain the initial angle of the substrate from a position of the notch.

5. The polishing apparatus according to claim 1, wherein:
    the elastic membrane defines an annular pressure chamber into which a fluid is to be supplied for pressing the substrate against the polishing surface;
    the polishing apparatus further comprises a pressure regulator configured to regulate a pressure of the fluid in the annular pressure chamber; and
    the polishing controller is configured to operate the pressure regulator to periodically change the pressure in the annular pressure chamber in synchronization with the rotation angle of the polishing head.

6. The polishing apparatus according to claim 1, further comprising:
    a retainer-ring pressing mechanism configured to press the retainer ring against the polishing surface,
    wherein the polishing controller is configured to operate the retainer-ring pressing mechanism to periodically change a pressure of the retainer ring against the polishing surface in synchronization with the rotation angle of the polishing head.

7. The polishing apparatus according to claim 1, further comprising:
    a vertically moving mechanism configured to elevate and lower the polishing head,
    wherein the polishing controller is configured to operate the vertically moving mechanism to periodically change a height of the polishing head in synchronization with the rotation angle of the polishing head.

8. The polishing apparatus according to claim 1, further comprising:
    a local-load exerting device configured to apply a local load to a part of the retainer ring,
    wherein the polishing controller is configured to operate the local-load exerting device to periodically change the local load in synchronization with the rotation angle of the polishing head.

9. The polishing apparatus according to claim 1, wherein the polishing controller is configured to periodically change an angular velocity of the polishing head in synchronization with the rotation angle of the polishing head.

10. A polishing method of polishing a substrate by bringing the substrate into sliding contact with a polishing surface, comprising:
    holding the substrate by a polishing head;
    pressing the substrate against the polishing surface by the polishing head while rotating the polishing head; and
    changing a polishing condition of the substrate periodically in synchronization with a rotation angle of the polishing head when the substrate is pressed against the polishing surface.

11. The polishing method according to claim 10, further comprising:
    obtaining an initial angle of the substrate indicating an orientation of the substrate with respect to a circumferential direction of the substrate before the substrate is held by the polishing head; and
    obtaining an initial rotation angle of the polishing head before holding the substrate.

12. The polishing method according to claim 10, wherein changing the polishing condition comprises periodically changing a pressing force of the polishing head applied to the substrate in synchronization with the rotation angle of the polishing head.

13. The polishing method according to claim 10, wherein:
    the polishing head has a retainer ring surrounding the substrate and being placed in contact with the polishing surface; and
    changing the polishing condition comprises periodically changing a pressure of the retainer ring against the polishing surface in synchronization with the rotation angle of the polishing head.

14. The polishing method according to claim 10, wherein changing the polishing condition comprises periodically changing a height of the polishing head in synchronization with the rotation angle of the polishing head.

15. The polishing method according to claim 10, wherein:
the polishing head has a retainer ring surrounding the substrate and being placed in contact with the polishing surface;
pressing the substrate against the polishing surface by the polishing head while rotating the polishing head comprises pressing the substrate against the polishing surface by the polishing head and applying a local load to a part of the retainer ring while rotating the polishing head; and
changing the polishing condition comprises periodically changing the local load in synchronization with the rotation angle of the polishing head.

16. The polishing method according to claim 10, wherein changing the polishing condition comprises periodically changing an angular velocity of the polishing head in synchronization with the rotation angle of the polishing head.

\* \* \* \* \*